United States Patent [19]

Henderson

[11] 4,047,024

[45] Sept. 6, 1977

[54] PHOTOELECTRIC DISC READER WITH ALTERNATE READING LOCATIONS

[75] Inventor: Benjamin B. Henderson, Raleigh, N.C.

[73] Assignee: Westinghouse Electric Corporation, Pittsburgh, Pa.

[21] Appl. No.: 668,029

[22] Filed: Mar. 18, 1976

[51] Int. Cl.² ............................................. G01D 5/34
[52] U.S. Cl. ........................... 250/231 SE; 340/347 P
[58] Field of Search ................ 324/175; 250/231 SE, 250/237 R, 237 G, 233; 356/169, 170; 340/347 P

[56] References Cited

U.S. PATENT DOCUMENTS

| | | | |
|---|---|---|---|
| 3,770,971 | 11/1973 | Somerset | 250/233 |
| 3,800,204 | 3/1974 | Kenney | 250/231 SE |
| 3,814,934 | 6/1974 | Mesh et al. | 324/175 |
| 3,963,919 | 6/1976 | Sells | 340/347 P |
| B 503,618 | 3/1976 | Willits | 250/231 SE |

*Primary Examiner*—David C. Nelms
*Attorney, Agent, or Firm*—R. W. Smith

[57] ABSTRACT

A photoelectric pulse initiator includes a rotating pattern having a single track of indicia scanned by two optoelectronic sensors. The sensors having different mounting relationships for scanning different indicia patterns. Alternate impulses from the sensors produce opposite polarity pulses in a three wire remote meter reading telemetry system.

2 Claims, 6 Drawing Figures

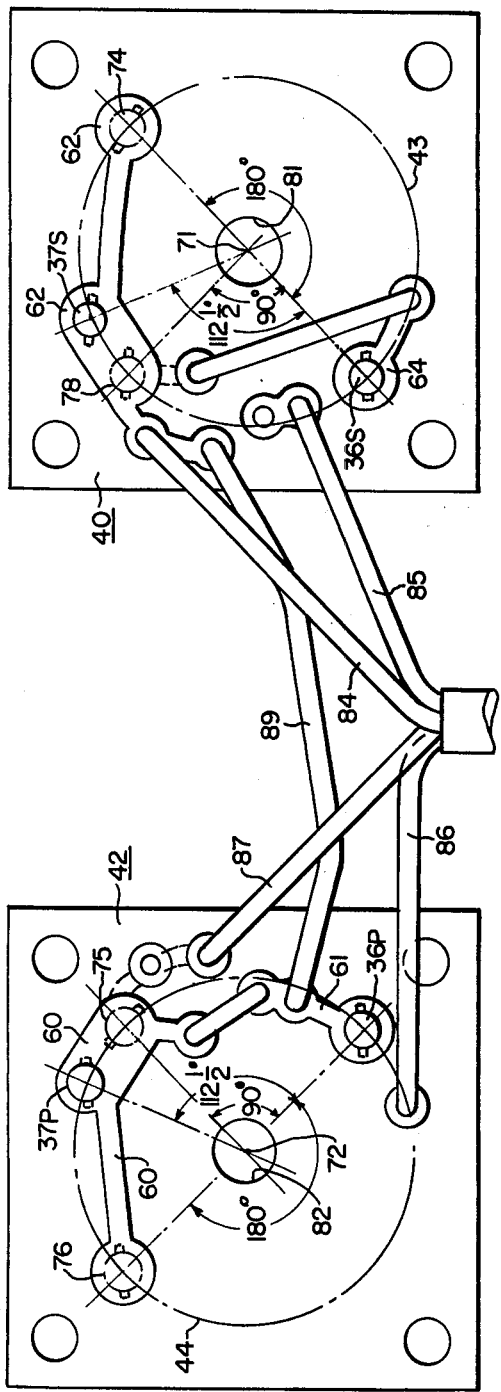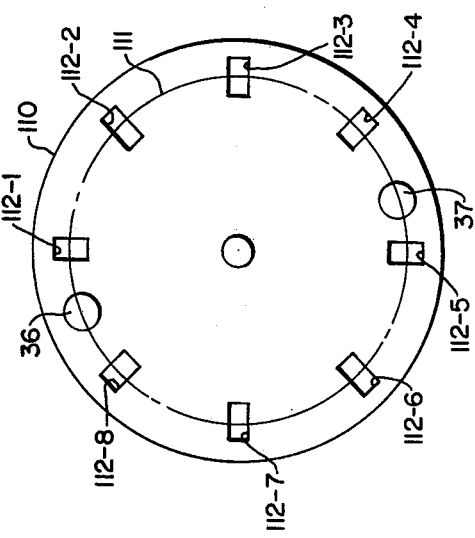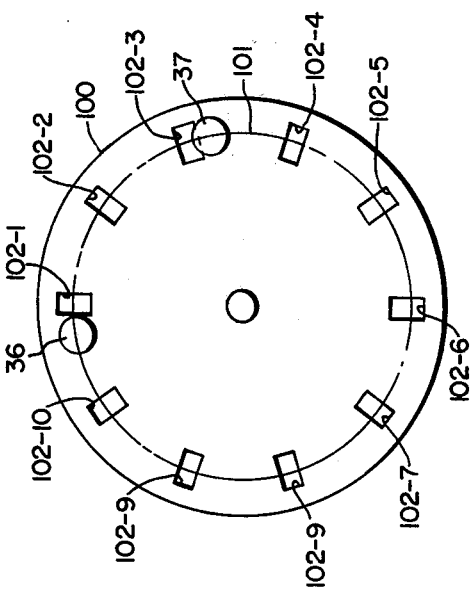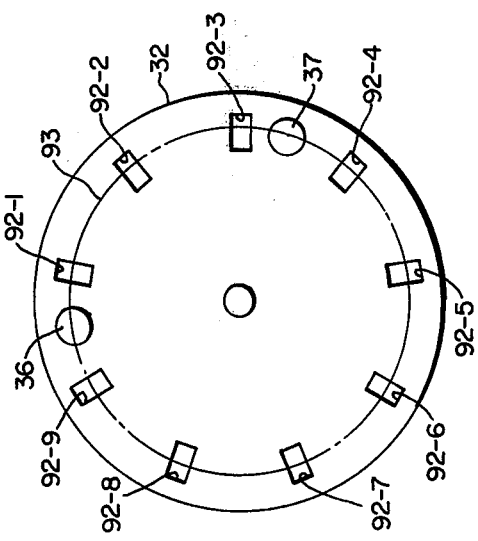

PHOTOELECTRIC DISC READER WITH ALTERNATE READING LOCATIONS

BACKGROUND OF THE INVENTION

This invention relates to photoelectric pulse initiator for utility meter type three wire telemetry and recording systems and more particularly to such pulse initiators having a single track pattern scanned by two optoelectronic sensors.

The use of pulse initiators in utility meters is well known particularly in the field of electric utility metering. Output pulses produced by the pulse initiators are applied through a three wire telemetry system to a receiver which often includes a demand or load survey magnetic recorder. The pulses are generated in response to movement of a utility meter such as a watthour meter which is rotated at a rate corresponding to the consumption of electric power measured by the watthour meter. As disclosed in U.S. pat. Nos. 3,733,493 issued May 15, 1973 and 3,878,391 issued Apr. 15, 1975, both assigned to the assignee of this invention, techniques for detecting rotation of the meter movement include a rotating two track pattern which optically activates two optoelectronic sensors. These sensors are alternately activated to produce impluses which control an output pulse generator. The output pulses are produced as opposite polarity pulses through either of two conductors and a common conductor of a three wire telemetry system.

Important considerations in the manufacturing use of pulse initiators include a simple and low cost unit intended for reliable service under varying operating conditions. An electro-optical pattern and sensing assembly included in the pulse initiators preferably affords flexibility in the choice of different desired pulse rates. These pulse rates are responsive to different predetermined amounts of the quantity measured by the meter as particularly described in the aforementioned U.S. Pat. No. 3,878,391. The patent describes how different pulse energy values are determined with respect to the different revolution per pulse constants associated with each pulse initiator of a watthour meter.

The aforementioned patents are directed to photoelectric pulse initiators having reflective patterns which are rotated by a watthour meter movement. These patterns include two rows of reflecting indicia or segments wherein each row is associated with a separate sensor. Rotation of the two rows of segments produces impulses alternately from the two sensors. This is required in order to produce the self-latching operation of an output pulse generator. The output pulses from one type of generator are produced by a mercury wetted self-latching relay which is operated by opposite directions of impulse current flow to produce the opposite polarity pulses in three wire telemetry systems.

One known alternative to the use of patterns of reflecting segments is the use of a shutter disc which includes slots that periodically pass light between an illuminating source and a photoelectric or radiation responsive sensor. Pulse initiators having shutter discs are disclosed in U.S. Pat. Nos. 3,311,824 issued Mar. 28, 1967 and 3,114,081 issued Dec. 10, 1963. In the U.S. Pat. No. 3,311,824 two shutter discs are described each having a slot pattern for controlling the light from a single illuminating source to two sensors. Alternate impulses are generated in response to the rotation of the two shutter discs by a watthour meter shaft rotation. The use of two discs require additional space over the use at a single disc and the difficulty of orienting the discs precisely relative to each other.

In the U.S. Pat. No. 3,114,081 a single shutter disc is utilized having a single sensor which is exposed to the light exposed through a single slotted disc. The disc slots are formed with both radially and circumferentially extending slot areas intersecting each other. Rotation of the shutter disc effects three different levels of radiation. impinging the sensor. This arrangement requires precise control of different levels of light on a single photo-electric sensor which is used to modulate a current signal having a reference plus more positive and more negative current levels.

SUMMARY OF THE INVENTION

In accordance with the present invention a photoelectric pulse initiator for remote metering telemetry and recording systems includes a single track pattern rotated by a meter movement at a rate responsive to the level of a measured quantity. The pattern includes a single circular track of slot indicia which are substantially equally circumferentially spaced. First and second optoelectronic sensors are aligned on a common circular axis concentric with the circular axis of the pattern track. The sensors have a predetermined arcuate spacing which has a predetermined relationship relative to the arcuate separation between the indicia of the pattern. When one sensor is activated by the slot indicia the other sensor is substantially equidistantly spaced between adjacent indicia of the pattern. In one preferred form of the invention solid state optoelectronic sensors are mounted on a support assembly and are easily positioned in different angularly spaced relationships relative to a single track pattern disc which is replaced by other patterns having varying numbers of slot indicia to provide various combinations of pulse rates in response to predetermined amounts of meter rotation.

It is a general feature of this invention to provide an improved electro-optical pattern and sensing assembly having a simple pattern formed by a disc selectable from different discs having different numbers of slots formed in a single circular row. Another feature of this invention is to provide a single pattern having a reduced diameter size while affording increased choice of the numbers of indicia for providing various pulse rates. It is a still further important feature of this invention to utilize a single track of slot indicia wherein each slot is capable of activating both of two radiation sensors to provide alternate impulses controlling a three wire output pulse generator. A still further feature of this invention is to provide variable sensor positioning arrangements on circuit boards so as to simply and precisely orient sensor radiation source-pickup pairs in different angular positions relative to each other when associated with different patterns of slot indicia provided in different pattern discs.

BRIEF DESCRIPTION OF THE DRAWINGS

FIG. 2 illustrates an outer plan view of two sensor mounting boards prior to final installation in the electro-optical pattern and sensing assembly shown in FIG. 1;

FIGS. 4A, 4B and 4C are diagrammatic views of different slot pattern arrangements used in the associated pattern and sensing assembly.

DETAILED DESCRIPTION OF THE PREFERRED EMBODIMENT

Figure 1:
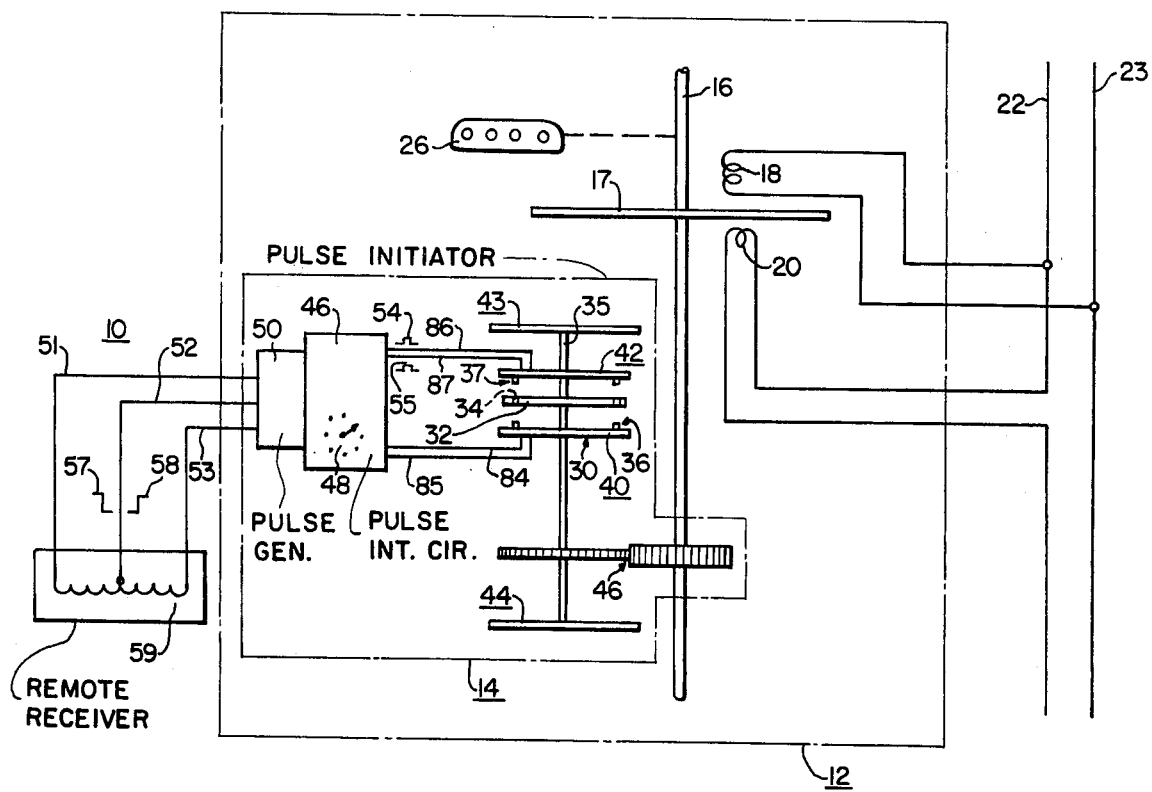
FIG. 1 is a schematic view of a remote metering telemetry system including the photoelectric pulse initiator having an electro-optical pattern and sensing assembly made in accordance with the present invention.

Referring now to the drawing and more particular to FIG. 1 there is illustrated a schematic view of a remote telemetry system 10. A watthour meter 12 is equipped with a photoelectric pulse initiator 14 made in accordance with the present invention as described in detail hereinbelow.

The watthour meter 12 is a well known integrating type including an electro-responsive meter movement having a rotatable shaft 16 and meter disc 17 and includes a potential coil 18 and a current coil 20. The coils 18 and 20 are connected to power line conductors 22 and 23 so as to electromagnetically drive the disc 19 at a predetermined measuring rate corresponding to the electrical energy quantity to be measured by the meter 12. Typically, the meter 12 includes a dial register 26 driven by the shaft 16 to provide a visual dial reading of the electrical energy consumption supplied through the conductors 22 and 23.

The pulse initiator 14 generally includes an electro-optical pattern and sensing assembly 30 including a pattern portion formed by a disc 32 having indicia for indicating the movement of the meter disc 17. The pattern indicia are formed by slots 34 arranged in a single track axis or row as described more fully hereinbelow in the description of the FIGS. 4A, 4B and 4C. The disc 34 is carried by a shaft 35. The sensing portion of the assembly 30 includes two optoelectronic sensors 36 and 37 formed by solid state radiation responsive source-pickup pairs 36S and 36P and 37S and 37P. The illumination or radiation sources 36S and 37S are carried on a first sensor mounting circuit board 40 mounted adjacent the disc 32. The sources preferably include light emitting diodes. The pickup devices 36P and 37P are formed by light responsive transistor devices and are mounted on a second sensor mounting circuit board 42 above the disc. The known characteristics of the transistor devices include being rendered to an active conducting state from an inactive non-conducting state by the source radiations. The source-pickup pairs forming the sensors 36 and 37 are adjustably mounted in predetermined fixed orientations on the circuit boards 40 and 42 on equal and aligned cicular axes 43 and 44, shown in FIGS. 3 and 4, having centers that are vertically aligned. The sensors are radially aligned with the circular axis that the slots 34 are positioned along as also described further hereinbelow.

The circuit boards 40 and 42 are carried in a bracket support assembly carried by the meter frame and including top and bottom plates 43 and 44, respectively. The pulse initiator 14 also includes a gear rain assembly 46. The shaft 35 supporting the disc 34 is driven by the gear assembly 46 from the watthour meter shaft 16. As described in the aforementioned U.S. Pat. No. 3,878,391 the gear train assembly may have different fixed gear ratios to further adjust the desired output pulse rate to provide a predetermined pulse electric energy value as measured by the meter 12. The sensors 36 and 37 may be connected into an electronic pulse initiating circuit as disclosed in the aforementioned U.S. Pat. No. 3,733,493 and preferably it is contemplated that in a preferred embodiment the present invention will be utilized in a electronic pulse initiating circuit as disclosed in U.S. Pat. No. 3,943,498 issued Mar. 9, 1976 to T. M. McClelland III et al. and assigned to the assignee of this invention. In the latter noted application there is disclosed a pulse initiating circuit for producing a variable pulse rate as obtained by a pulse division selector 48 as described therein. As noted in the aforementioned prior patents, the variation and control of the number of output pulses in response to given amounts of meter shaft rotation can be controlled by varying the gear train assembly gear ratio, the pulse division ratio and the number of slot indicia provided on the pattern disc. An output pulse generator 50 is connected to the output of the pulse initiating circuit 46 and, as disclosed in the aforementioned patents, may include a self-latching mercury wetted three wire relay having output contacts. The output pulse generator 50 is connected to telemetry conductors 51, 52 and 53 included in the system 10. Impulses 54 and 55 from the electro-optical pattern and sensing assembly 30 occur when the pickups 36P and 37P control the output generator 50. Output pulses 57 and 58 are developed between the conductors 51 and 52 and between 53 and 52, respectively. The conductors 51, 52 and 53 are connected at their remote ends to a remote receiver 59 which can include a recorder or pulse totalizing device.

Figure 3:
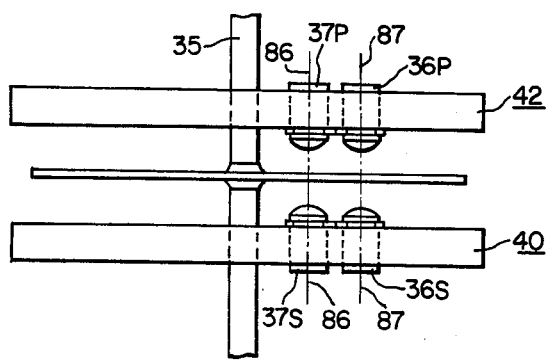
FIG. 3 is a side view of the sensor mounting boards after being assembled in the pattern and sensing assembly.

Referring now to FIGS. 2 and 3, there are shown details of the improved electro-optical pattern and sensing assembly 30. The outer sides of the sensor mounting circuit boards 40 and 42 are shown in FIG. 2 prior to assembly in the relationship shown in FIGS. 1 and 3. In FIG. 2, layouts of the circuit boards 40 and 42 are shown in which printed conductors 60 and 61 are shown on the top circuit board 42 and conductors 62 and 64 are shown for the bottom circuit board 40. The optoelectronic sensors 36 and 37 are carried on the boards 40 and 42 so as to be aligned with the slot indicia 34 of a pattern disc 32. The source 36S and pickup 36P of the sensor 36 are mounted in fixed relationships relative to the boards 40 and 42, respectively. The radiation source 36S is mounted in a hole and in a fixed conductive relationship on the printed conductor 64 as shown in FIG. 2. Accordingly, the radiation pickup 36P is secured within a hole of the circuit board 42 so as to be in conductive relationship with the printed circuit conductor.

The sensor 37 is mounted in variable predetermined arcuate relationships with the sensor 36 along the equal circular axes 43 and 44 having a center coinciding with the center axes 71 and 72 of the circuit boards 40 and 42. The source 37S and pickup 37P are shown in arcuately spaced positions each 112½° from the fixed reference positions of the source 36S and pickup 36P. Alternate positions of the radiation pickup 37P are designated by the broken lines 75 and 76 in conductive relationship with the printed conductor 60 and oriented on the axis 44 at arcuate distances of 90° and 180° from the position of the pickup 36P. The radiation source 37S is correspondingly oriented at the broken line positions 78 and 79 on the axis 43 at arcuate distances of 90° and 180° from the fixed reference position of the pickup 36P. Holes are drilled at the positions by broken lines 75 and 78 or 76 and 79 receive the radiation pickup 37P and source 37S at 90° or 112½° spacings from the pickup 36P and source 36S.

Circular holes 81 and 82 are formed in the circuit boards 42 and 40, respectively about the center axes 71 and 72 for receiving the shaft 35 carrying the pattern disc 32. Wire conductors 84 and 85, connected to printed conductors 62 and 64 connect the sources 36S and 37S to the pulse initiator circuit 46. The wires 87 and 88 are connected to separate terminals of the pickups 36P and 37P and the pulse initiating circuit 46. The wire 89 interconnects conductors of the two boards as shown.

FIG. 3 illustrates the assembled position of the circuit boards 40 and 42 receiving the shaft 35 through holes 81 and 82 thereof. The pattern 32 is positioned substantially equidistant axially between the boards 40 and 42 so that the optoelectronic sensors 36 and 37 are aligned with the slot indicia 34 of the disc 32 as described more fully in connection with the description of FIGS. 4A, 4B and 4C. When the center axes 71 and 72 are aligned, the sources 36S and 37S are aligned with the pickups 36P and 37P along the axes 86 and 87, respectively, as shown in FIG. 3. This also positions the circular axes 43 and 44 in mutually aligned relationship in the parallel planes of the circuit boards 40 and 42. It is to be understood that the radiation sensor-pickup pair 37S–37P remain aligned along the axis 86 as they are moved to the three predetermined positions.

FIGS. 4A, 4B and 4C illustrate different pattern discs arrangements and the corresponding different sensor positions for affecting variable pulse rate outputs from the pulse initiator 14 shown in FIG. 1. The FIG. 4A illustrates the pattern disc 32 shown relative to the position of the sensor arrangements 36 and 37 at the 125½° angle separation. The pattern 34 of slot indicia in the disc 32 is formed by nine equally spaced slot indicia 92-1 to 92-9. The substantially rectangular slots 92-1 through 92-9 are centered along a circular track or axis 93 which is of the same diameter as are the axes 43 and 44 of the circuit boards 40 and 42. Upon rotation of the disc 32 the slot indicia are axially positioned along the axes 86 and 87 and between the sources and pickups 36S and 36P and 37S and 37P to permit the emitted light of the sources to be transmitted to the pickups. The pickups are activated to initiate the impulses 52 and 53 shown in FIG. 1 which are applied to the pulse initiating circuit 46. The disc portions between the slots are opaque to interrupt the radiations to render the pickup inactive.

It is noted hereinabove that the optoelectronic sensors 36 and 37 are positioned at an angle of separation of 112½°. Accordingly, the slots 92-1 to 92-9 are equally circumferentially spaced at arcuate distances of forty degrees along the axis 93. The angular relationships between the sensors 36 and 37 and the slots 92-1 through 92-9 result in the positioning of a slot in axial alignment with one sensor while the other sensor is positioned substantially midway between two adjacent slot indicia. For example, if the disc 32 is rotating in a counterclockwise direction, as indicated by the directional arrow 95, the slot 92-1 will be positioned directly between the radiation source 37S and pickup 37P tp activate the pickup 37P. Concurrently, the sensor 36 including the source 36S and pickup 36P will be aligned arcuately substantially midway between the slot indicia 32-3 and 32-4. Upon the slots 92-4 reaching the aligned relationship with the sensor 36, the sensor 37 will be positioned arcuately substantially midway between the slots 92-1 and 92-2. This produces the alternate impulses 52 and 53 by the sources 36S and 37S shown in FIG. 1. The impulses are required to be alternately produced as noted in the above-identified U.S. Pat. Nos. 3,733,493 and 3,878,391 which accomplish alternate impulses by the use of a pattern which has two rows or tracks of indicia that are sensed by two sensors corresponding to sensors 36 and 37 described herein. An important aspect of the present invention is the advantage that this invention provides variable pulse rates with respecct to the rate of rotation of the watthour meter movement and affords a very compact arrangement. For example, the diameter of the pattern disc described herein such as pattern disc 32 has a diameter in the order of 0.7 inch (17.8 cm) with the slot openings having a length of about 0.06 inch (0.15 cm) and a width of about 0.033 inch (0.08 cm). The size of the pattern is limited while required to afford optical isolation between the sensor pickups. Also a so-called deadband spacing must be provided by the distance between slots so that there is sufficient time for circuit reaction and transitions in the pulse initiating circuit 46 in response to the separate impulses 54 and 55.

Variation in different angles between the sensors 36 and 37 and different numbers of slot indicia on the pattern discs produces different output pulse rates at the output of the initiator as explained hereinafter. In FIG. 4B there is shown an alternative pattern disc 100 having ten slot indicia 102-1 through 102-10. These are all substantially the same size and oriented in the circular track or row on the axis 101 having the same diameter as axis 93. The angular relationship between the sensors 36 and 37 is 90°. The spacing between adjacent slot indicia is approximately 36°. This will position a slot indicia in axial alignment with one sensor while the other sensor will be positioned substantially midway between adjacent indicia slots. This affords alternate impluses from the sensor radiation pickups 36P and 37P upon rotation of the pattern disc 32. The positions of the sensors 36 and 37 in FIG. 4B are provided by orienting the radiation source 37S at the position indicated by the numeral 78 on the board 40 in FIG. 2 and the pickup 37P at the position indicated by the numeral 75 on the circuit board 42.

FIG. 4C illustrates a further alternative pattern disc 110 having eight slot indicia 112-1 through 112-8 separated at an arcuate distancce of 45° along the circular pattern axis or track 111 having the same diameter as axis 93. The sensors are arcuately spaced at a distance of 180° and this corresponds to the position 76 for the pickup 37P on the circuit board 42 with the source 37S being positioned at the position 79 on the circuit board 40.

In accordance with the description of the three different patterns of slot indicia and the corresponding orientation of the sensors 36 and 37 as shown in FIGS. 4A, 4B and 4C. It is to be understood that there are other alternative relationships which are used in the preferred embodiment of this invention. The angles between the sensor can always be established by determining the number of slots and the substantially equal distances separating the slots. The angular spacing between the sensors will be equal to an integral number times the slot angular spacing plus one-half the angular spacing. In the arrangement shown in FIG. 4A the sensor arrangements 36 and 37 could be oriented at an angle of 67½° which is the distance between two adjacent slot indicia plus one-half this distance. For different numbers of slot indicia corresponding relationships would be established between the angular relationship of the sensors and the arcuate separating distance between the adjacent equally circumferentially spaced slot indicia.

The three arrangements described hereinabove for the sensors 36 and 37 allow flexible alternative assemblies for producing the different number of output pulse rates. A Table noted hereinbelow shows the variations of pulse outputs from the pulse initiator with the use of five different pattern discs including six, seven, eight, nine and 10 slots the latter three being shown in the FIGS. 4A, 4B and 4C in combination with the associated three angular relationships of the sensors 36 and 37. With pattern disc including six and seven slots the equal spacing between the slots are 60° and 51.43°, respectively. Utilizing the pulse division selector 48 included in the pulse initiating circuit as disclosed in the aforementioned U.S. patent application Ser. No. 509,611, output pulses 57 and 58 per rotation of the pattern disc 32 are indicated in the following table:

TABLE

| Output Pulses Per Rotation Of Disc 32 | Pattern Slot Indicia No. | Angle Of Slot Indicia | Angle Of Sensors 36 & 37 | Impulses Per Rotation Of Disc 32 | Pulse Div. Setting Of Selector 48 |
|---|---|---|---|---|---|
| 1 | 10 | 36° | 90° | 20 | 20 |
| 2 | 10 | 36° | 90° | 20 | 10 |
| 3 | 9 | 40° | 180° | 18 | 6 |
| 4 | 8 | 45° | 112.5° | 16 | 4 |
| 5 | 10 | 36° | 90° | 20 | 4 |
| 6 | 6 | 60° | 90° | 12 | 2 |
| 7 | 7 | 51.43° | 180° | 14 | 2 |
| 8 | 8 | 45° | 112.5° | 16 | 2 |
| 9 | 9 | 40° | 180° | 18 | 2 |
| 10 | 10 | 36° | 90° | 20 | 2 |
| 12 | 6 | 60° | 90° | 12 | 1 |
| 14 | 7 | 51.43° | 180° | 14 | 1 |
| 16 | 8 | 45° | 112.5° | 16 | 1 |
| 18 | 9 | 40° | 180° | 18 | 1 |
| 20 | 10 | 36° | 90° | 20 | 1 |

In accordance with the description of the present invention as described hereinabove a simple and unique manner of producing pulse initiator output pulses at a self-latching three wire output generator is afforded by simply interchanging the pattern discs and the angular orientation of the sensors 36 and 37 on the printed circuit boards 40 and 42 in the electro-optical pattern and sensing assembly 30. The assembly 30 requires a minimum of space which is of significant importance since it is mounted to the frame of a watthour meter and within standard covers used to provide a housing for the metering movement.

While preferred embodiments of the present invention are described hereinabove, it is contemplated that other alternative embodiments may be made without departing from the spirit and scope of this invention.

I claim:

1. A pulse initiator for producing pre-selected pulse rates in a three wire remote metering telemetry system in response to equal rotations of a watthour meter rotating movement, said pulse initiator comprising:

first and second parallel mounting boards assembled to a watthour meter;

plural pattern discs, each having different numbers of equally circumferentially spaced slot indicia disposed in identical circular tracks, each of said plural pattern discs being interchangeably mountable between said first and second mounting boards in driven relationship with the meter rotating movement;

first and second optoelectronic sensors each including a radiation source optically aligned with a radiation pickup, said sources and pickups of said first and second sensors having plural alternate mounting locations on identical circular axes of said first and second mounting boards, respectively, so as to have plural alternate circumferential spacings therebetween, said circular axes being oriented for alignment with each other and said circular tracks of said pattern discs, each of said alternate circumferential spacings being associated with a different one of said pattern discs so as to have a related arcuate spacing equal to a multiple of the indicia slot spacing plus one-half of the slot spacing, whereby rotation of the slotted indicia between the sensors and pickups produces interrupted radiations that alternately activate the pickups of said first and second sensors and produce alternate equally spaced impulses in accordance with a preselected pulse rate;

first and second printed circuit conductors disposed on said first and second mounting boards, respectively, and extending to alternate mounting locations for at least one of each of the radiation sources and radiation pickups so as to provide fixed common electrical connections between the alternate source and pickup mounting locations; and circuit means including an output pulse generator connected to a three wire telemetry system and receiving said impulses so as to produce output pulses at said preselected pulse rate.

2. The pulse initiator as claimed in claim 1 wherein said mounting boards include hole openings extending through said first and second printed circuit conductors at the alternate mounting locations for carrying said source and said pickup of one of said first and second optoelectronic sensors.

* * * * *